United States Patent

Tsukikawa

[11] Patent Number: 5,905,679
[45] Date of Patent: May 18, 1999

[54] SEMICONDUCTOR MEMORY DEVICE CLAMPING THE OVERSHOOT AND UNDERSHOOT OF INPUT SIGNAL BY CIRCUIT WITH PN JUNCTION

[75] Inventor: Yasuhiko Tsukikawa, Hyogo, Japan

[73] Assignee: Mitsubishi Denki Kabushiki Kaisha, Tokyo, Japan

[21] Appl. No.: 09/045,567

[22] Filed: Mar. 23, 1998

[30] Foreign Application Priority Data

Sep. 30, 1997 [JP] Japan .................................. 9-266057

[51] Int. Cl.[6] ...................................................... G11C 7/00
[52] U.S. Cl. ........................................ 365/189.06; 257/355
[58] Field of Search ........................ 365/189.06, 189.01, 365/226; 257/355, 356, 357, 360, 361

[56] References Cited

U.S. PATENT DOCUMENTS

| 5,181,091 | 1/1993 | Harrington, III et al. | 257/355 |
| 5,235,201 | 8/1993 | Honna | 257/357 |
| 5,349,227 | 9/1994 | Murayama | 257/361 |
| 5,581,103 | 12/1996 | Mizukami | 257/355 |
| 5,708,610 | 1/1998 | Okasaka et al. | 365/189.06 |

FOREIGN PATENT DOCUMENTS 6-045523  2/1994  Japan .

*Primary Examiner*—Son Mai
*Attorney, Agent, or Firm*—McDermott, Will & Emery

[57] ABSTRACT

An input signal applied to a terminal receiving an external signal (e.g. a data input/output terminal DQj) is transmitted by an input signal line. A p well formed in a main surface of a p substrate is electrically isolated from the p substrate by an n well and a triple n well. The p well and the n well receive a potential level of the signal input line. An n diffusion layer is formed in a main surface of the p well and receives an external power supply potential Vdd.

8 Claims, 18 Drawing Sheets

FIG.20 PRIOR ART

A diagram labeled SAB (top) and WDB (bottom) showing an array of alternating WORD DRIVER and MEMORY CELL BLOCK columns, with SENSE AMPLIFIER rows interspersed between memory cell block rows.

SEMICONDUCTOR MEMORY DEVICE CLAMPING THE OVERSHOOT AND UNDERSHOOT OF INPUT SIGNAL BY CIRCUIT WITH PN JUNCTION

BACKGROUND OF THE INVENTION

1. Field of the Invention

The present invention relates to a semiconductor memory device, and particularly to a semiconductor memory device, and particularly to a configuration of a semiconductor memory device operable in response to a rapidly applied external signal.

2. Description of the Background Art

Rapid operation of a semiconductor memory device requires rapid changes in the rising and falling of a signal externally input to the semiconductor memory device.

This results in setting high driving capability of a signal driver circuit of an external device which provides data to the semiconductor memory device.

However, the interconnections on the board where a semiconductor memory device is actually mounted equivalently have, for example, a parasitic, distributed inductance component. Accordingly, a larger change rate of an input signal relative to time causes a greater disturbance in waveform of the signal taken into the semiconductor memory device.

FIG. 12 shows how the waveform of an input signal changes with time in a semiconductor memory device. In the figure, the high level of the input signal is the level of a potential VIH and the low level of the input signal is the level of a potential VIL.

When the input signal starts to rise from a low level to a high level at time t1, the waveform of the signal taken into the semiconductor memory device exceeds potential level VIH and results in a so-called overshooting waveform, as described above.

When the input signal similarly falls from a high level to a low level at time t2, the waveform of the input signal has an undershoot due to a parasitic inductance component existing in an interconnection on the board.

However, the presence of such overshoot and undershoot in the waveform of an input signal causes unstable operation of the semiconductor memory device and also degrades the stability in operation of the exact system configured on the board where the semiconductor memory device is mounted.

Accordingly, the waveforms of input signals are shaped generally in semiconductor memory devices to suppress generation of the overshoot and undershoot of the input signals.

FIG. 13 is a circuit diagram showing a configuration of a clamp circuit 700 which is on-chip incorporated into semiconductor memory device, for shaping input waveforms.

In FIG. 13, an n-channel MOS transistor Q1 is provided between a signal line 704 transmitting a signal applied to an input pad 702 and a power supply potential Vdd. An n-channel MOS transistor Q2 is also provided between signal line 704 and a ground potential GND. The gate of n-channel MOS transistor Q1 is connected to signal line 704 and is in diode connection such that the direction from signal line 704 towards power supply potential Vdd is a forward direction.

Similarly, the gate of n-channel MOS transistor Q2 is coupled with ground potential GND and is in diode connection such that the direction from ground potential GND toward signal line 704 is a forward direction.

FIG. 14 is a cross section for illustrating a configuration in cross section of clamping circuit 700 shown in FIG. 13.

N-channel MOS transistors Q1 and Q2 are both provided in a p-type well 722 formed in the main surface of a p-type substrate 720.

P-type well 722 is biased to e.g. a substrate potential Vbb supplied from a substrate potential generating circuit (not shown) which receives an external power supply potential and a ground potential to generate a negative substrate potential.

With the configuration of clamp element 700 shown in FIGS. 13 and 14, n-channel MOS transistor Q1 is turned on when the level of an input signal is higher than a potential Vdd+Vth, wherein Vth represents a threshold voltage of n-channel MOS transistor Q1.

Meanwhile, the back bias of n-channel MOS transistor Q1 is potential Vbb and a potential Vsb between the substrate and the source of n-channel MOS transistor Q1 is thus Vsb=Vdd+|Vbb| in providing a clamping operation. Thus, n-channel MOS transistor will be affected by large substrate effect. Note that |Vbb| represents the absolute value of substrate potential Vbb.

Accordingly, when a threshold voltage Vth of n-channel MOS transistor is 0.8 V in the normal substrate bias state, the threshold voltage rises to e.g. a Vth of approximately 1.2 V due to a large substrate effect.

Thus, the configuration of clamp circuit 700 shown in FIGS. 13 and 14 has a disadvantage that clamping effect cannot be effectively provided.

Furthermore, the configuration shown in FIGS. 13 and 14 is disadvantageously less resistant to input surge, since the clamp elements are both formed of n-channel MOS transistors and the oxide films of the n-channel MOS transistors are destroyed by input surge. It is thus difficult to employ the configuration of clamp circuit 700 shown in FIGS. 13 and 14 in the devices practically used.

FIG. 15 is a circuit diagram showing a configuration of a clamp circuit 800 as another example of the clamp circuit which is on-chip incorporated into a semiconductor memory device.

Clamp circuit 800 has a p-channel MOS transistor Q3 provided between signal line 704 and power supply potential Vdd.

The gate of p-channel MOS transistor Q3 is coupled with power supply potential Vdd and is thus in diode connection such that the direction from signal line 704 toward power supply potential Vdd is a forward direction.

The remaining configuration is similar to the configuration of clamp circuit 700 shown in FIG. 13, and hence the identical portions are designated by the identical reference characters and the description thereof is not repeated.

FIG. 16 is a cross section for illustrating the configuration in cross section of clamping circuit 800 shown in FIG. 15.

P-channel MOS transistor Q3 is provided in an n-type well 820 formed in the main surface of p-type substrate 720, and n-channel MOS transistor Q2 is provided in a p-type well 822 provided adjacent to n-type well 820.

N-type well 820 is biased to power supply potential Vdd and p-type well 822 is biased to ground potential GND.

P-type substrate 720 is required to be biased to the ground potential due to following reason: for the configuration of clamp circuit 800 shown in FIG. 16, a p-type diffusion region 824 corresponding to the drain region of p-channel MOS transistor Q3 connected to the input signal line and n-type well 820 are forwardly biased when the potential level of an input signal reaches or exceeds Vdd+Vbi, wherein Vbi represents a forward threshold voltage of pn junction. Furthermore, since the substrate is of p-type, a pnp bipolar transistor configured of p-type diffusion region 824, n-type well 820 and p-type substrate 720 is turned on.

Thus, clamp current flows from p-type diffusion region 824 to p-type substrate 720. Accordingly, if p-type substrate 720 is supplied with potential from a substrate potential generating circuit (not shown), for example, the clamp current will flow into the substrate potential generating circuit.

The clamp current flowing into the substrate will cause a positive potential in the substrate. This will induce latch-up phenomenon in CMOS circuit, which is fatal to proper operation of DRAM.

P-type substrate 720 is thus required to be biased to ground potential GND.

Meanwhile, in operating as a clamp element, pn junction is advantageously greater in current absorbing ability than MOS transistor.

Accordingly, it can be said that the configuration of clamp circuit 800 is more desirable than that of clamp circuit 700 shown in FIG. 13 in that clamp circuit 800 further suppresses overshoots of input signals.

FIG. 17 is a circuit diagram showing a configuration of a clamp circuit 900 as still another example of the clamp circuit which is on-chip mounted in a semiconductor memory device.

In clamp circuit 900, a pn junction diode Q4 is connected between input signal line 704 and power supply potential Vdd such that the direction from signal line 704 toward power supply potential Vdd is a forward direction, and a pn junction diode Q5 is connected between ground potential GND and input signal line 704 such that the direction from ground potential GND toward input signal line 704 is a forward direction.

FIG. 18 is a cross section for illustrating the configuration in cross section of clamp circuit 900 shown in FIG. 17.

In FIG. 18, an n well 820 formed in a main surface of p-type substrate 720 is supplied with power supply potential Vdd.

Meanwhile a p well 922 provided adjacent to n well 920 is supplied with ground potential GND.

Input signal line 704 is connected to a p-type diffusion region 924 provided in a main surface of n-type well 920. Input signal line 704 is also connected to an n-type diffusion region 926 formed in a main surface of p-type well 922.

Such a configuration results in forward bias of p-type diffusion region 924 connected to the signal line and n well 920 when the potential level of an input signal reaches or exceeds potential Vdd+Vbi, as in clamp circuit 800 described with reference to FIG. 16. Since the substrate is also of p-type in this example, a pnp bipolar transistor configured of p-type diffusion region 924, n well 920 and p-type substrate 720 is turned on.

Thus, clamp current flows p-type diffusion region 924 to p-type substrate 720, as in the example shown in FIG. 16. That is, the p-type substrate in clamp circuit 900 shown in FIG. 18 must also be connected to ground potential GND.

In this example, the clamp element is a pn junction diode and is thus larger in current absorbing ability than MOS transistor. Furthermore, the use of a pn junction diode as a clamp element dispenses with oxide film and thus has an advantage that oxide film is not destroyed by input surge.

It is thus greatly advantageous to configure a clamp circuit by employing a pn junction diode.

FIG. 19 shows a configuration in cross section of a memory cell array portion in a semiconductor memory devices particularly in a dynamic random access memory (DRAM), and FIG. 20 is a plan view of the configuration of the memory cell array.

In FIG. 19, p-type well 740 is provided in a main surface of p-type substrate 720. A memory cell is arranged in p-type well 740.

In general, each memory cell is configured of a single n-channel MOS transistor 750 and a single memory cell capacitor (not shown).

N-channel MOS transistor 750 is referred to as an access transistors and opens and closes the connection between one electrode of the memory cell capacitor and a selected pair of bit lines.

P-type well 740 is fixed at a negative voltage Vbb lower than the ground potential to increase the threshold voltage of the access transistor and increase the holding time of electric charge stored in a memory cell.

P-type well 740 is also provided with an n-type MOS sense amplifier 752 which is responsive to the data read from a memory cell for amplifying the potential level of a pair of bit lines connected to the selected memory cell.

An n-type well 742 is provided adjacent to p-type well 740. Provided in n-type well 742 is a p-channel MOS type sense amplifier 754 which cooperates with n-channel type MOS sense amplifier 752 to amplify the potential level of a pair of bit lines in response to the data stored in a selected memory cell. The potential level of n-type well 742 is fixed at a power supply potential Vcc of the p-channel MOS type sense amplifier, wherein power supply potential Vcc represents an internal power supply potential down-converted from external power supply voltage Vdd by a voltage-down converter (not shown) mounted in the semiconductor memory device.

Another n-type well 744 is also provided adjacent to p-type well 740. Formed in n-type well 744 is a p-channel type MOS transistor 756 of the transistors which configure a word driver circuit for driving the potential level of a selected word line. In general, the high level output from a word driver for driving a word line is a level of voltage Vpp higher that of internal power supply voltage Vcc in order to avoid the effect of voltage drop caused by the access transistor. Voltage Vpp is generated from external power supply voltage Vdd by means of a booster circuit mounted in the semiconductor integrated circuit device.

N-type well 744 is thus fixed at the potential Vpp level.

Referring now to FIG. 20 the memory cell array is divided into a plurality of memory cell blocks, each provided with a band of sense amplifiers SAB. Each memory cell block is also provided with a band of word drivers WDB provided with the word driver circuits shown in FIG. 19 such that the band of word drivers WDB and the band of sense of amplifiers SAB intersect with each other.

FIG. 21 is a cross section of another example of a memory cell array configuration of a conventional DRAM.

The memory cell array shown in FIG. 21 is similar in plan configuration to the memory cell array shown in FIG. 20.

In the configuration shown in FIG. 21 also, n-channel MOS transistor 750 included in a memory cell, n-channel MOS sense amplifier 752 configuring a sense amplifier, and n-channel MOS transistor 758 configuring a word driver are provided in p-type well 740 formed in a main surface of p-type substrate 720.

P-type well 740 is fixed at a negative voltage Vbb lower than ground potential GND to increase the threshold voltage of the access transistor and increase the holding time of electric charge stored in the memory cell.

Provided adjacent to p-type well 740 is n-type well 742 within which p-channel MOS sense amplifier 754 configuring a sense amplifier is provided The potential level of n-type well 742 is fixed at internal power supply voltage Vcc.

The configuration shown in FIG. 21 is different from that shown in FIG. 19 in that the word driver circuit for driving a word line is constituted only by n-channel MOS transistor 758.

Thus, a circuit of so-called self-boost type is applied as the word driver in the configuration shown in FIG. 21.

Accordingly in driving the potential level of a word line in the configuration shown in FIG. 21, the word driver circuit requires the sequence of providing a precharge operation followed by a boost operation.

As a result, it disadvantageously takes longer time to activate a word line and access speed is thus delayed, as compared with the configuration shown in FIG. 19.

In both FIGS. 19 and 21 also, the potential level of the p-type substrate is held at the potential level of the p-type well, i.e., substrate potential Vbb.

Accordingly, use of clamping circuits 800 and 900 shown in FIGS. 15 to 18 in DRAMs with the configurations shown in FIGS. 19 and 21 entails the following disadvantage: in both clamp circuit 800 in FIG. 15 and clamp circuit 900 in FIG. 17, the potential level of the p-type substrate need be ground potential GND. By contrast, in both of the configurations shown in FIGS. 19 and 21, the potential level of the p-type substrate must be substrate potential Vbb. Accordingly, the exact clamp circuits 800 and 900 cannot be applied to the DRAM shown in FIG. 19 or 21.

Such a disadvantage can be solved by employing a configuration of a DRAM which has a cross sectional configuration as shown in FIG. 22.

The DRAM in FIG. 22 is different in cross sectional configuration from that shown in FIG. 19 as follows.

More specifically, in the configuration of the DRAM shown in FIG. 22, p-type well 740 is electrically isolated from p-type substrate 720 by the introduction of a triple n-type well 746.

In other words, the configuration shown in FIG. 22 allows the potential level of p-type well 740 to be held at substrate potential Vbb, the potential level of n-type well 744 to be held at boosted potential Vpp, and the potential level of the p-type substrate to be set at the ground potential.

The configuration shown in FIG. 22, however, entails the following disadvantage.

More specifically, the configuration shown in FIG. 22 needs an n-type well 748 provided between p-type well 740 and n-type well 742 and adjacent to p-type well 740 so that p-type well 740 is completely surrounded by an n-type well.

Thus, n-type well 744, triple n-type well 746 and n-type well 748 completely surround p-type well 740 and the potential level thereof is held at boosted potential Vpp.

Meanwhile, the potential level of n-type well 742 provided with p-channel MOS sense amplifier 754 need be held at internal power supply potential Vcc and accordingly an isolation band 780 need be provided between n-type wells 748 and 742.

The provision of such an isolation band will, however, increase the area of the memory cell array and hence chip area if a plurality of bands of sense amplifiers are provided in the memory cell array, as shown in FIG. 20.

The potential level of p-type well 740 can also be set at substrate potential Vbb and the potential level of the p-type substrate can be set at ground potential GND by, for example, fixing the potential level of triple n-type well 746 to Vcc.

In this example, p-type well 740 need be completely surrounded by triple well 746, n-type well 748 and a new n-type well provided between n-type well 744 and p-type well 740 so that it is electrically isolated from the p-type substrate.

In this example, an isolation band is required between n-type well 744 provided with p-channel MOS transistor 756 configuring a word driver and the new n-type well provided to surround p-type well 740.

Accordingly, the area of the memory cell array and hence chip area will also be increased in this example if a plurality of word drivers are provided in the memory cell array, as shown in FIG. 20.

SUMMARY OF THE INVENTION

One object of the present invention is provided a semiconductor memory device capable of mounting a clamp circuit which employs a pn junction.

Another object of the present invention is to provide a semiconductor memory device capable of restrain the chip area from increasing when a clamp circuit employing a pn junction is mounted thereon.

In summary, the present invention is a semiconductor memory device formed of a semiconductor substrate of a first conductivity, and includes an input pad, a first power supply pad, a second power supply pad, a substrate potential generating circuit, an input signal line, a first well region, a second well region, and a first impurity-doped region.

The input pad receives an external signal. The first power supply pad receives a first power supply potential The second power supply pad receives a second power supply potential.

The substrate potential generating circuit receives the first and second power supply potentials, generates a substrate potential and supplies the generated substrate potential to the semiconductor substrate.

The input signal line transmits a signal input to the input pad. The first well region of a second conductivity is formed in a main surface of the semiconductor substrate and receives a potential level of the input signal line. The second well region of the first conductivity is formed in the first well region such that the first well region surrounds the second well region except for the main surface thereof, and receives a potential level of the input signal line. The first impurity-doped region of the second conductivity is formed at a main surface of the second well region and receives the second power supply potential.

In another aspect, the present invention is a semiconductor memory device formed on a semiconductor substrate of a first conductivity and includes an input pad, a first power supply pad, a second power supply pad, a substrate potential generating circuit, an input signal line, a first well region, a second well region, and a second impurity-doped region.

The input pad receives an external signal. The first power supply pad receives a first power supply potential The second power supply pad receives a second power supply potential.

The substrate potential generating circuit receives the first and second power supply potentials, generates a substrate potential and supplies the generated substrate potential to the semiconductor substrate.

The input signal line transmits a signal received at the input pad. The first well region of a second conductivity is formed in a main surface of the semiconductor substrate and receives a predetermined potential. The second well region of the first conductivity is formed in the first well region such that the first well region surrounds the second well region except for the main surface thereof, and receives the first power supply potential.

The second impurity-doped region of the second conductivity is formed at a main surface of the second well region and receives a potential level of the input signal line.

Thus, a main advantage of the present invention is that when the input pad receives an input signal reaching or exceeding a predetermined absolute value, a pn junction formed of the first or second impurity-doped region and the second well region is forwardly biased and the potential level of the input signal line is clamped. Since the clamp circuit employs a pn junction, it has high current absorbing capability and is highly resistant to surge input.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 20 shows a plan pattern of a conventional DRAM memory cell.

DESCRIPTION OF THE PREFERRED EMBODIMENTS

First Embodiment

Figure 1:
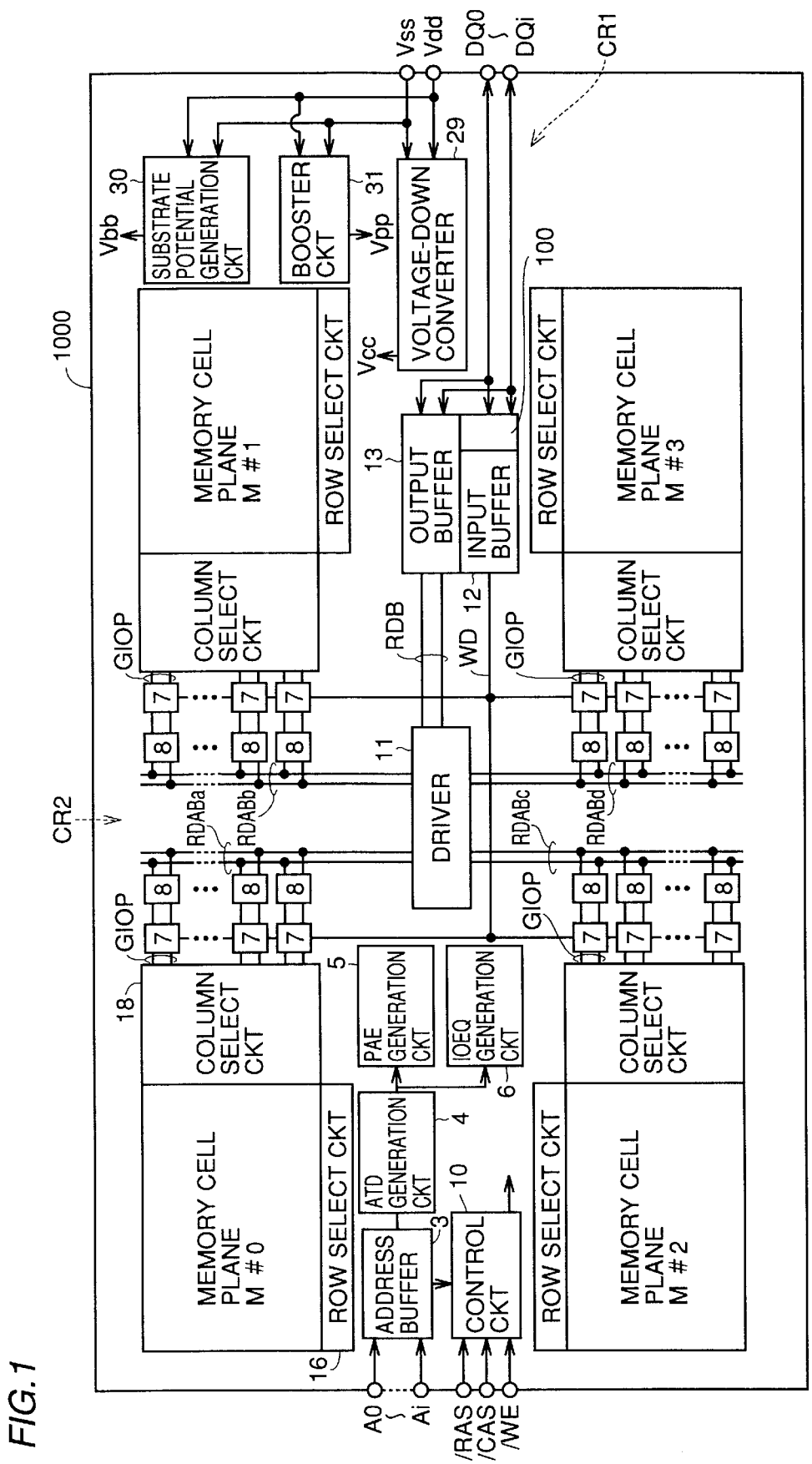
FIG. 1 is a schematic block diagram of a configuration of a semiconductor memory device 1000 according to a first embodiment of the present invention.

FIG. 1 is a schematic block diagram showing a configuration of a semiconductor memory device 1000 according to a first embodiment of the present invention.

Semiconductor memory device 1000 in FIG. 1 includes four memory cell planes M#0–M#3 isolated by center regions CR1 and CR2 which extend lengthwise and widthwise, respectively.

Memory cell planes M#0–M#3 each have e.g. a memory capacity of 16M bits. That is, semiconductor memory device 1000 has a memory capacity of 64M bits.

In semiconductor memory device 1000, each memory cell plane is provided with a row select circuit 16 (a row predecoder, a row decoder and a word line driver) and a column select circuit 18 (a column predecoder, a column decoder and an IO gate) for selecting a memory cell in response to an externally applied address signal, as described later.

While FIG. 1 shows the word line driver and the like existing only at one longitudinal side of each memory cell plane, they are arranged practically in a plurality of bands in each memory cell plane, as will be described later.

Memory cell planes M#0–M#3 are each divided into e.g. 16 column groups and each column group is provided with a respective pair GIOP of global IO lines. When any of memory cell planes M#0–M#3 is selected, a memory cell of one bit is selected in each column group and is coupled with a pair GIOP of global IO lines of the selected memory cell.

Semiconductor memory device 1000 also includes a preamplifier/write buffer 7 provided for a pair GIOP of global IO lines for inputting and outputting data to and from the pair GIOP of global IO lines, a read driver 8 provided for preamplifier/write buffer 7 for amplifying the internal read data from a respective preamplifier and transmitting the amplified internal read data to a read data bus RDAB (RDABa–RDABd), and a driver circuit 11 which receives signals on read data buses RDABa–RDABd and selectively transmits the applied signals to an output buffer 13 via an output bus RDB.

Preamplifier/write buffer 7 transmits the data of a memory cell of a selected column group in each of memory cell planes M#0–M#3 via read driver 8 onto a respective one of read buses RDABa–RDABd.

The write buffer of preamplifier/write buffer 7 is coupled with an input buffer 12 via an input data bus WD. Write buffers 7 for a selected one of memory cell planes M#0–M#3 are activated and data is written via write buffer 7 into a selected memory cell included in a selected column group in the selected memory cell plane.

Semiconductor memory device 1000 also includes an address buffer which receives an externally applied address signal and generates an internal address signal; an ATD generation circuit 4 which detects a change in an internal address signal (an internal column address signal) from address buffer 3 to generate an address change detection signal ATD; a PAE generation circuit 5 which is responsive to address change detection signal ATD from ATD generation circuit 4 for generating a preamplifier enable signal PAE for activating the preamplifier included in preamplifier/write buffer 7; an IOEQ generation circuit 6 which is responsive to address change detection signal ATD from ATD generation circuit 4 for generating an equalization designating signal IOEQ for equalizing the pair GIOP of global IO lines; and a control circuit 10 which receives externally applied row address strobe signal /RAS, column address strobe signal /CAS and write enable signal /WE and an internal address signal from the address buffer to output a signal for controlling an operation of DRAM 1000.

The pair GIOP of global IO lines is configured of a pair of complementary signal lines and transmits data signals complementary to each other. Equalization signal IOEQ equalizes the potentials of the global 10 lines of the pair GIOP of global IO lines.

Semiconductor memory device 1000 also includes: an internal voltage-down converter 29 which receives an externally applied power supply potential Vdd and generates an internal power supply voltage Vcc lower than external power supply potential Vdd; a substrate potential generating circuit 30 which receives external power supply potential Vdd and a ground potential Vss and generates a negative, substrate potential Vbb; and a booster circuit 31 which receives external power supply potential Vdd and ground potential Vss and outputs a boosted potential Vbb boosted from external power supply potential Vdd.

Internal power supply potential Vcc is applied to a well in which a circuit for driving memory cell planes M#0–M#3 (a sense amplifier for charging and discharging a bit line) and a p-channel MOS transistor in the array are formed.

Output buffer 13 and input buffer 12 communicate data with the external of the device via a common data input/output terminal DQ0–DQi.

Provided between input buffer 12 and data input/output terminal DQj (j=0 to i) is a clamp circuit 100 for providing an operation of clamping an input signal level Such a clamp circuit 100 is provided for each of input/output terminals for receiving externally applied signals.

More specifically, clamp circuit 100 is also provided for an address signal input terminal and input/output terminals for external control signals (signals /RAS, /CAS, /WE and the like).

Hereinafter, however, to simplify the description, clamp circuit 100 provided for data input/output terminal DQj will be exemplified and described.

Figure 2:
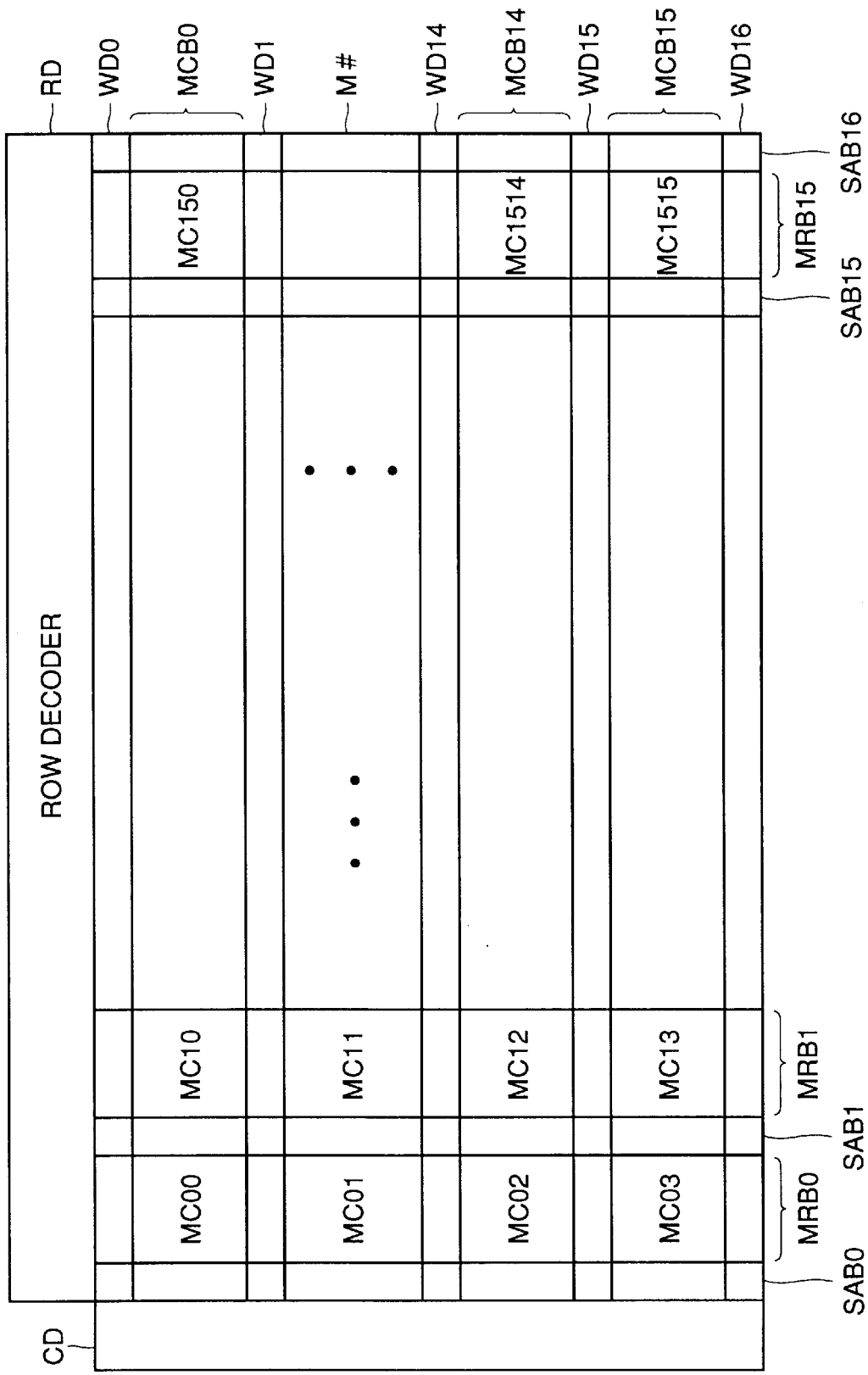
FIG. 2 specifically shows a configuration of a single memory cell plane shown in FIG. 1.

FIG. 2 more specifically shows a configuration of a portion related to a single memory cell plane M# (hereinafter, M#0–M#3 are generally referred to as M#).

In FIG. 2, memory cell plane M# is divided into 16 row blocks MRB0–MRB15 in the column direction and 16 column blocks MCB0–MCB15 in the row direction.

More specifically, memory cell plane M# includes a memory cell block MCnn for each region at which a row block MRBn (n=0 to 15) and a column block MCBn (n=0 to 15) intersect. Each memory cell block MCnn has memory cells of 64K bits arranged in a matrix.

Arranged in regions between row blocks MRB0–MRB15 are bands SAB1–SAB15 of sense amplifiers for detecting and amplifying the data of memory cells selected in response to external address signals.

Bands of sense amplifiers SAB0 and SAB16 are also arranged outside the row blocks MRB0–MRB15.

A sense amplifier included in bands of sense amplifiers SABn and SAB (n+1) arranged at both sides of one row block MRBn (n=0 to 15) detects and amplifies the data of a memory cell connected to a selected one row.

Thus, bands of sense amplifiers SAB1–SAB15 are each shared by two row blocks.

Arranged between column blocks MCB0–MCB15 are bands WD1–WD15 of word drivers for activating word lines selected in response to external address signals.

Bands of word drivers word drivers WD0 and WD16 are also arranged outside the column blocks MCB0–MCB15.

A word driver included in bands of word drivers WDn and WD (n+1) arranged at both sides of a single column block MCBn (n=0 to 15) activates a word line corresponding to a selected row.

Thus, bands of word drivers WD1–WD15 are each shared by two column blocks.

Figure 3:
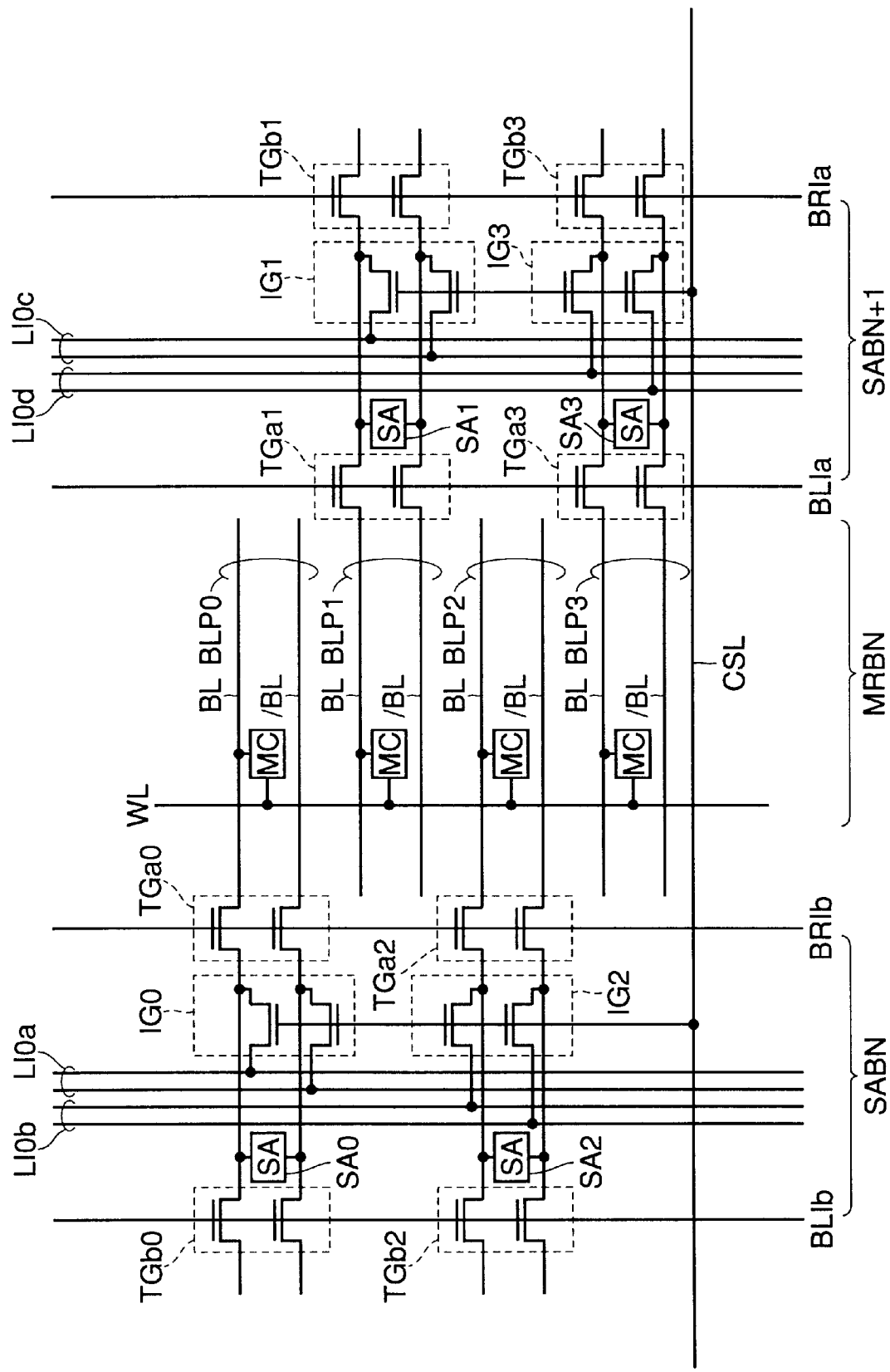
FIG. 3 specifically shows an arrangement of a band of sense amplifiers shown in FIG. 2.

FIG. 3 is a circuit diagram specifically showing a configuration of bands of sense amplifiers SABN and SABN+1 shown in FIG. 2.

FIG. 3 representatively shows a configuration of a portion associated with a single column select line CSL.

Column select line CSL in a column block selected in response to an external address signal is only set to a selected state, i.e., the potential level thereof attains a high level.

For example, four pairs of bit lines BLP0–BLP3 are arranged for one column select line CSL. The pairs of bit lines BLP0–BLP3 each include bit lines BL and /BL which transmit signals complementary to each other. The intersections of the pairs of bit lines BLP0–BLP3 and a word line WL are each provided with a corresponding memory cell MC.

FIG. 3 exemplarily shows memory cells MC arranged at the intersections of bit lines BL and a specific word line WL.

Memory cell MC includes an access transistor which is turned on by word line WL, and a memory cell capacitor having one electrode connected to a respective bit line by the access transistor.

The other electrode of the memory cell capacitor receives a cell plate potential Vcp, which is, in general, half the potential Vcc in magnitude.

The pairs of bit lines BLP0 and BLP2 are connected to their respective sense amplifiers SA0 and SA2 included in the band of sense amplifiers SABN via their respective isolation gates TGa0 and TGa2 which conduct in response to a bit line isolation control signal BRIb.

The pairs of bit lines BLP1 and BLP3 are connected to their respective sense amplifiers SA1 and SA3 included in the band of sense amplifiers SABN+1 via their respective isolation gates TGa1 and TGa3 which conduct in response to a bit line isolation control signal BLIa.

Sense amplifiers SA included in the band of sense amplifiers SABN are connected to their respective pairs of bit lines included in row block MRB (N−1) via their respective isolation gates TGb0 and TGb2 which conduct in response to isolation control signal BLIb.

Sense amplifiers SA included in the band of sense amplifiers SABN+1 are connected to their respective pairs of bit lines included in row block MRBN+1 via their respective isolation gates TGb1 and TGb3 which conduct in response to isolation control signal BRIa.

A sense amplifier SA is provided for each pair of bit lines and is shared by pairs of bit lines of adjacent row blocks. In one row block MRBN, sense amplifiers SA are arranged at both sides of pairs of bit lines in a staggering manner and are thus in a so-called, staggered, shared sense amplifier arrangement.

In the band of sense amplifiers SABN, pairs of local IO lines LIOa and LIOb are arranged in parallel with word line WL and extend through one column block.

The band of sense amplifiers SABN+1 has similarly arranged pairs of local IO lines LIOc and LIOd.

Sense amplifiers SA0–SA3 are respectively provided with column select gates IG0–IG3 which conduct in response to a signal potential on column select line CSL. When the signal potential on a corresponding column select line CSL attains a high level, which indicates a selected state, column select gates IG0–IG3 conduct and connect sense amplifiers SA0–SA3 with the pairs of local IO lines LIOa–LIOd, respectively.

When row block MRBN is selected, bit line isolation control signals BLIa and BRIb are set to a high level and bit line isolation control signals BRIa and BLIb are set to a low level. The pairs of bit lines BLP0–BLP3 are thus connected to sense amplifiers SA0–SA3, respectively.

In the standby state, bit line isolation control signals BLIa, BLIb, BRIa and BRIb are all set to a high level and isolation control gates TGa0–TGa3 and TGB0–TGB3 are all set in a conducting state.

In read operation or the like, a selected row block is only connected to sense amplifiers SA to reduce the totaled capacitances of pairs of bit lines connected to sense amplifiers SA to allow rapid sense operation and transmission of a sufficient read voltage to a sense node (i.e., data read from a memory cell).

The pairs of local 10 lines LIOa–LIOd are respectively connected to pairs of global IO lines GIOa–GIOd each arranged in a respective column group (not shown).

Figure 4:
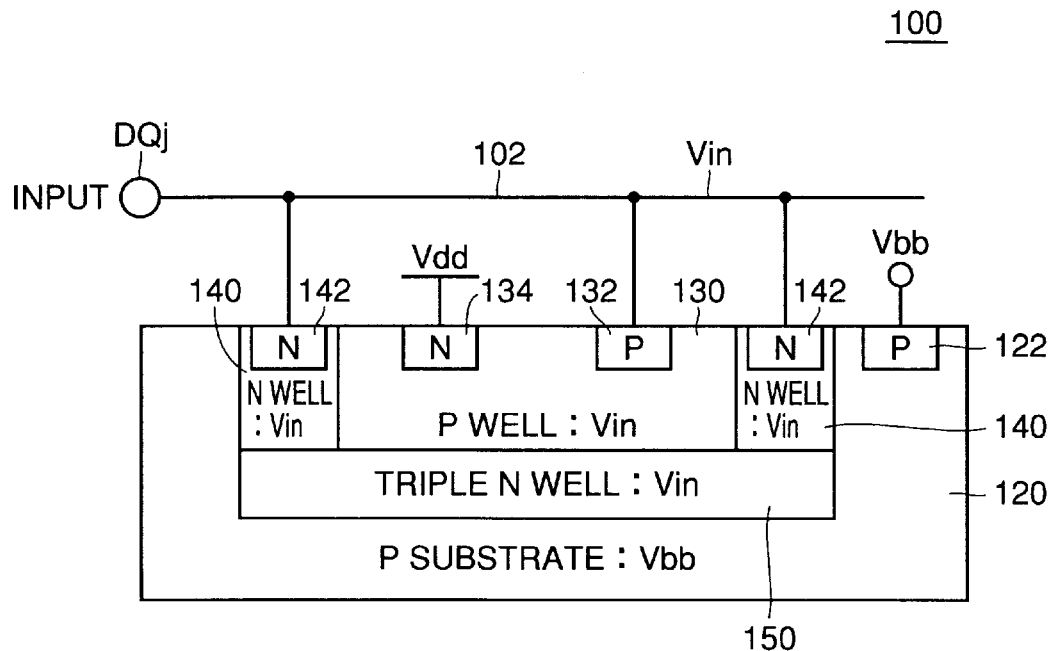
FIGS. 4, 5 and 6 are cross sections of respective configurations of clamp circuits 100, 200 and 300 according to the first, second and third embodiments of the present invention, respectively.

FIG. 4 is a cross section of a configuration of clamp circuit 100 provided in input buffer 12 shown in FIG. 1, for each data input/output terminal DQj (j=0 to i).

Clamp circuit 100 is supplied with substrate potential Vbb supplied from substrate potential generation circuit 30 via a p diffusion region 122.

Provided in a main surface of a p substrate 120 is a p well 130 which is circumferentially surrounded by an n well 140. A triple n well 150 is also provided in the substrate at the bottom portion of p well 130. Thus, n well 140 and triple n well 150 completely surround p well 130 except for the main surface of p well 130.

In clamp circuit 100 shown in FIG. 4, an input signal line 102 transmitting an input signal (potential level:Vin) from data input/output terminal DQj, and n well 140 are connected via an n diffusion region 142 formed in a main surface of n well 140.

Input signal line 102 and p well 130 are also electrically connected via a p diffusion region 132 formed in a main surface of p well 130.

Also, provided in a main surface of p well 130 is an n diffusion region 134 which receives external power supply potential Vdd.

When an input signal overshoots and its potential level exceeds the potential Vdd+Vbi in clamp circuit 100 of FIG. 4 as configured above, n diffusion region 134 and p well 130 receiving external power supply potential Vdd are forwardly biased, wherein Vbi represents a threshold voltage of pn junction. Thus, electrons flow from n diffusion region 134 to p well 130. The electrons thus injected into p well 130 are all absorbed in p well 130 or the surrounding n well 140 or triple n well 150, and overshooting is thus clamped.

It is also possible to set the potential of the p substrate at substrate potential Vbb, since no current flows into p substrate 120.

Thus, the clamp circuit 100 configured as above can clamp the potential level of input signal line 102 transmitting an input signal which is about to overshoot, with the potential level of p substrate 120 maintained at a negative, substrate potential Vbb.

Figure 19:
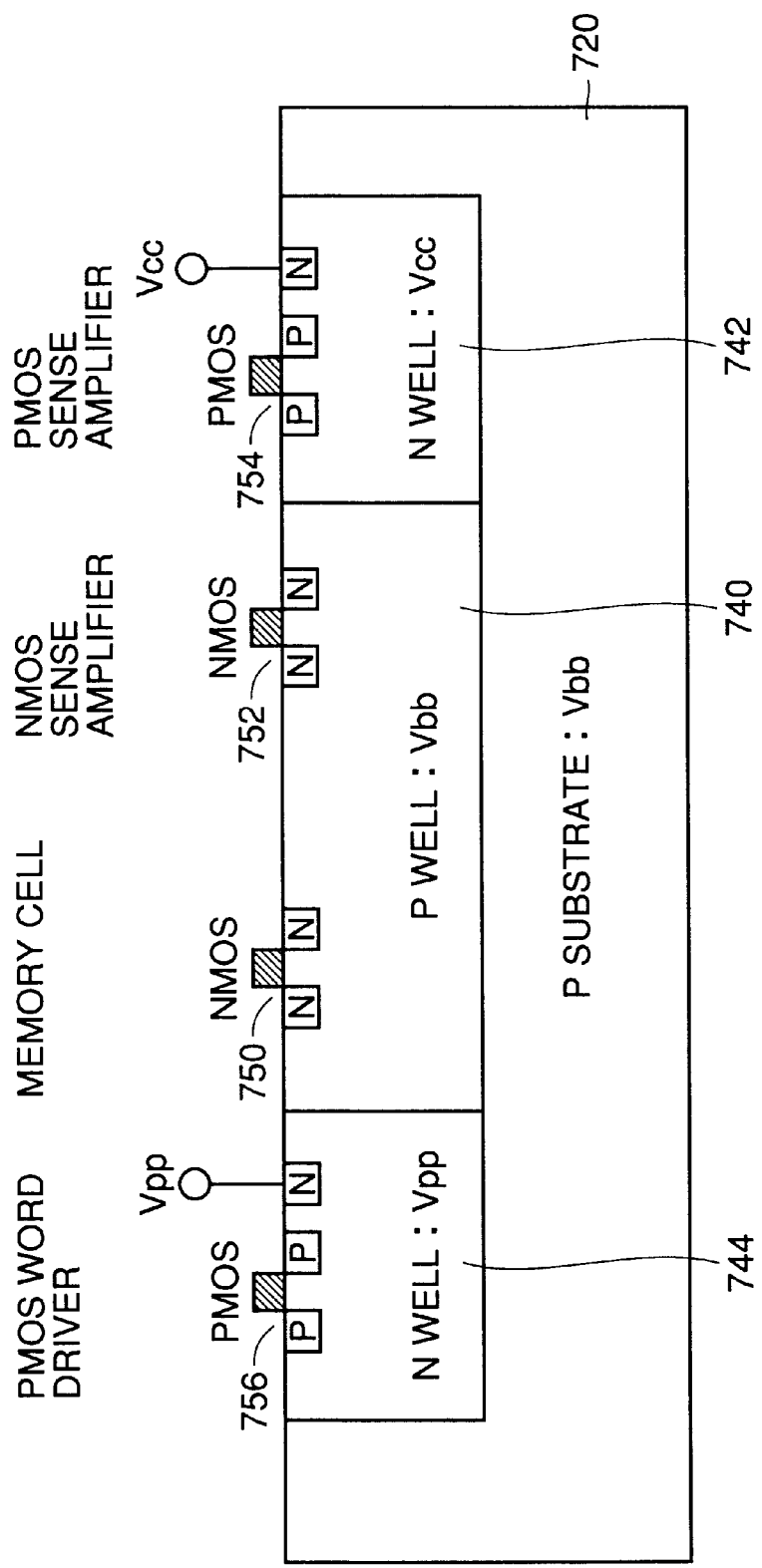
FIG. 19 is a cross section of a configuration of a conventional DRAM.
Figure 21:
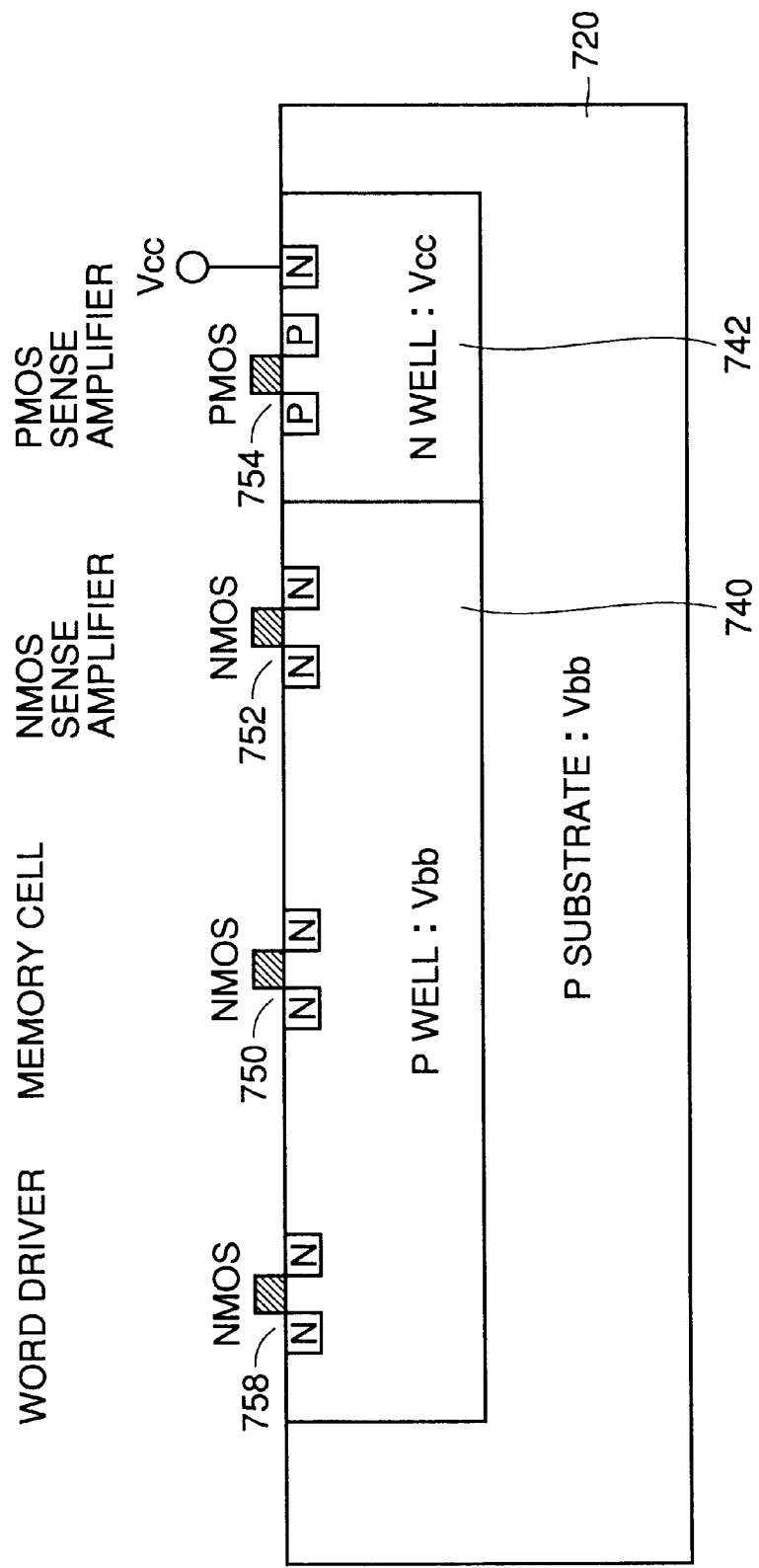
FIG. 21 is a cross section of another configuration of a conventional DRAM.
Figure 22:
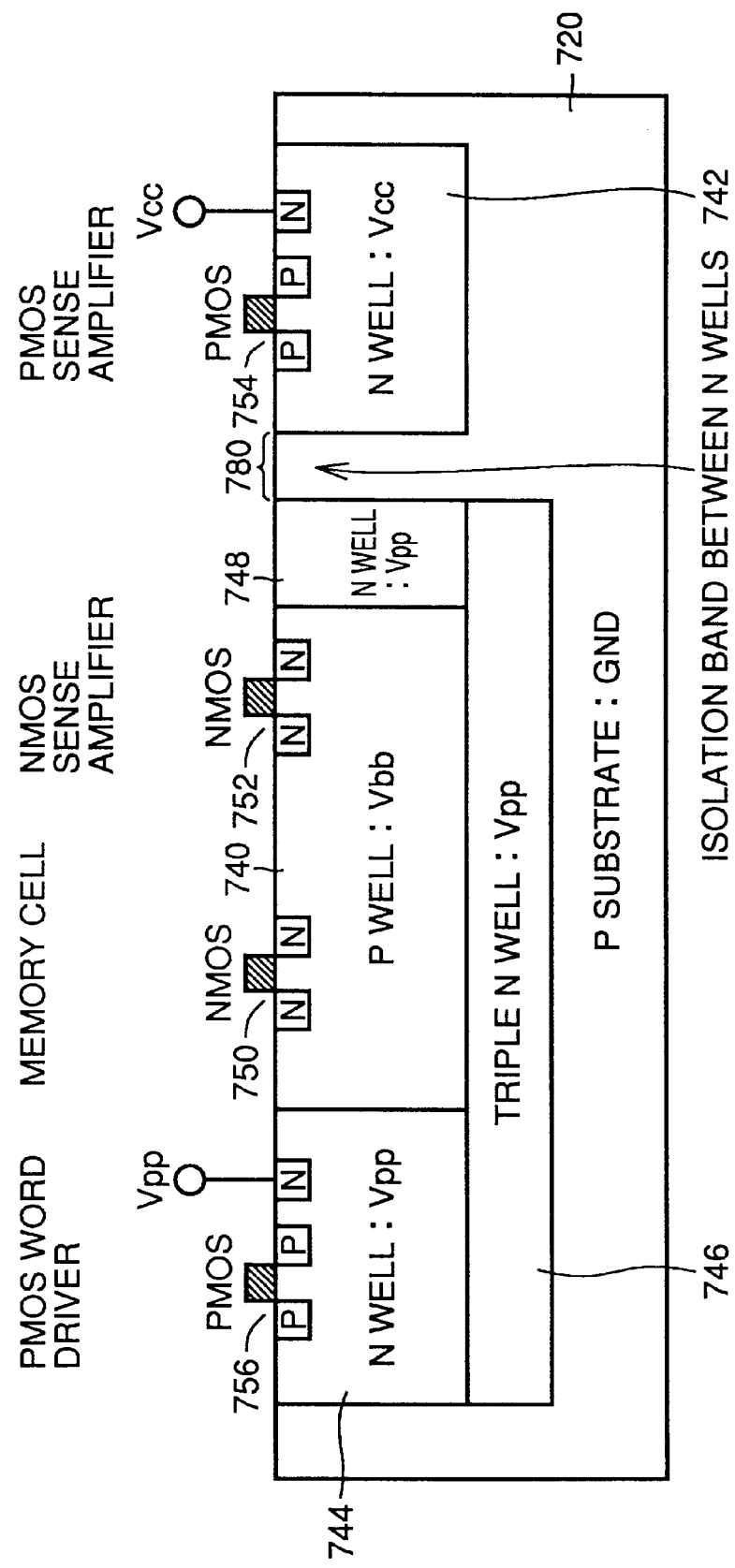
FIG. 22 is a cross section of another example of a conventional DRAM.

Accordingly, clamp circuit 100 can be formed on e.g. a p substrate, together with a DRAM shown in FIG. 19.

Second Embodiment

Figure 5:
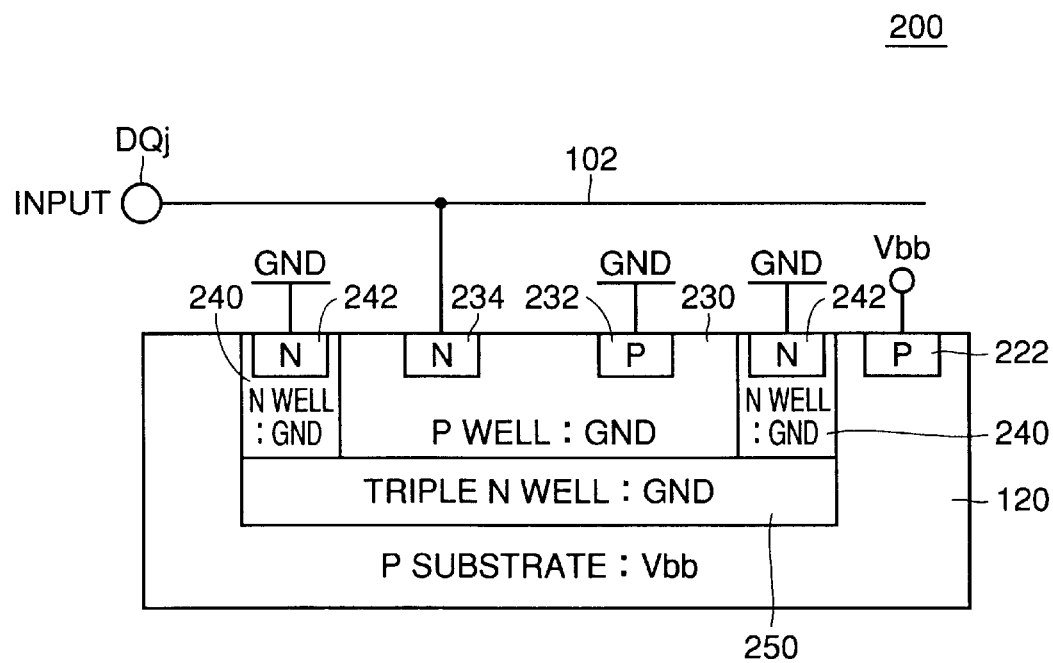

FIG. 5 is a cross section of a configuration of a clamp circuit 200 according to a second embodiment of the present invention.

In FIG. 5, a p substrate 120 receives a substrate potential Vbb from a substrate potential generation circuit 30 via a p diffusion region 222 formed in a main surface of p substrate 120.

A p well 230 is formed in a main surface of p substrate 120.

An n well 240 is formed to circumferentially surround p well 230, and a triple n well 250 is formed at a border region between a bottom surface of p well 230 and p substrate 220.

Thus, n well 240 and triple n well 250 completely surround p well 230 except for the main surface of p well 230.

N well 240 receives a ground potential GND via an n diffusion region 242 formed in a main surface of n well 240.

P well 230 also receives ground potential GND via a p diffusion region 232 formed in a main surface of p well 230.

An n diffusion region 234 is also formed in a main surface of p well 230.

N diffusion region 234 is electrically coupled with an input signal line 102 which transmits an input signal from a terminal (e.g. data input/output terminal DQj) for receiving an external signal.

The configuration as above allows n diffusion region 234 and p well 230 to be forwardly biased when the potential level of an input signal is no more than −Vbi.

Thus, electrons flow from n diffusion region 234 to p well 230. The electrons are all absorbed in p well 230, n well 240, and triple n well 250 and the input signal is clamped to ground potential GND.

According to this configuration, no current flows into p substrate 120 during clamp operation and the potential level of the p substrate can thus be set at substrate potential Vbb.

By contrast, if triple n well 250 is not present, the potential level of p well 230 will be potential Vbb. Accordingly, unless the level of an input signal is no more than −|Vbb| minus Vbi, the pn junction formed of n diffusion layer 234 and p well 230 is not forwardly biased and the clamping capability of clamp circuit 200 will be degraded.

With the configuration as shown in FIG. 5, the potential level of the p substrate can be maintained at substrate potential Vbb, while the capability of clamping the potential level of input signal line 102 to the ground potential side can be improved.

It should be noted that in the above description, the potential levels of n well 240 and triple n well 250 are maintained at ground potential GND.

However, the present invention is not limited to such an example and, for example, the potential level of p well 230 can be ground potential GND and the potential levels of n well 240 and triple n well 250 can be external power supply potential Vdd.

Third Embodiment

Figure 6:
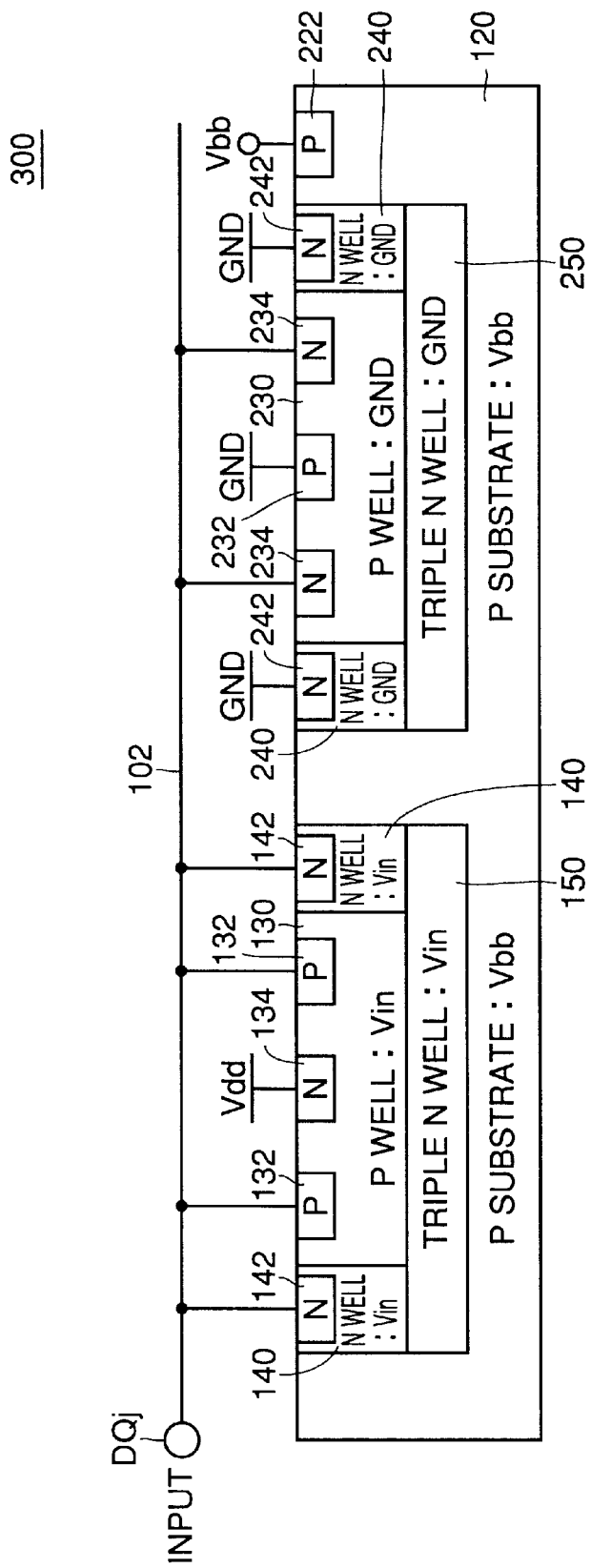

FIG. 6 is a cross section of a configuration of a column circuit 300 according to a third embodiment of the present invention.

Column circuit 300 has clamp circuit 100 for external power supply potential Vdd shown in the first embodiment and clamp circuit 200 for ground potential GND shown in the second embodiment both connected to an input/output signal line 102 which transmits a signal from a terminal (e.g. data input/output terminal DQj) for receiving an external signal.

It should be noted that p diffusion region 132 in FIG. 6 is provided in p well 130 at both sides of n diffusion region 134.

Furthermore n diffusion region 234 is provided in p well 230 at both sides of p diffusion region 232.

The portions identical to those of clamp circuits 100 and 200 of the first and second embodiments are designated by the identical reference characters and a description thereof will not be repeated.

With the configuration as shown in FIG. 6, clamp circuit 300 can clamp the potential level of input signal line 102 when the potential level of an input signal overshoots with respect to external power supply potential Vdd and undershoots with respect to ground potential GND.

In this example, the potential level of substrate 120 can also be maintained at substrate potential Vbb supplied from substrate potential generation circuit 30.

Figure 7:
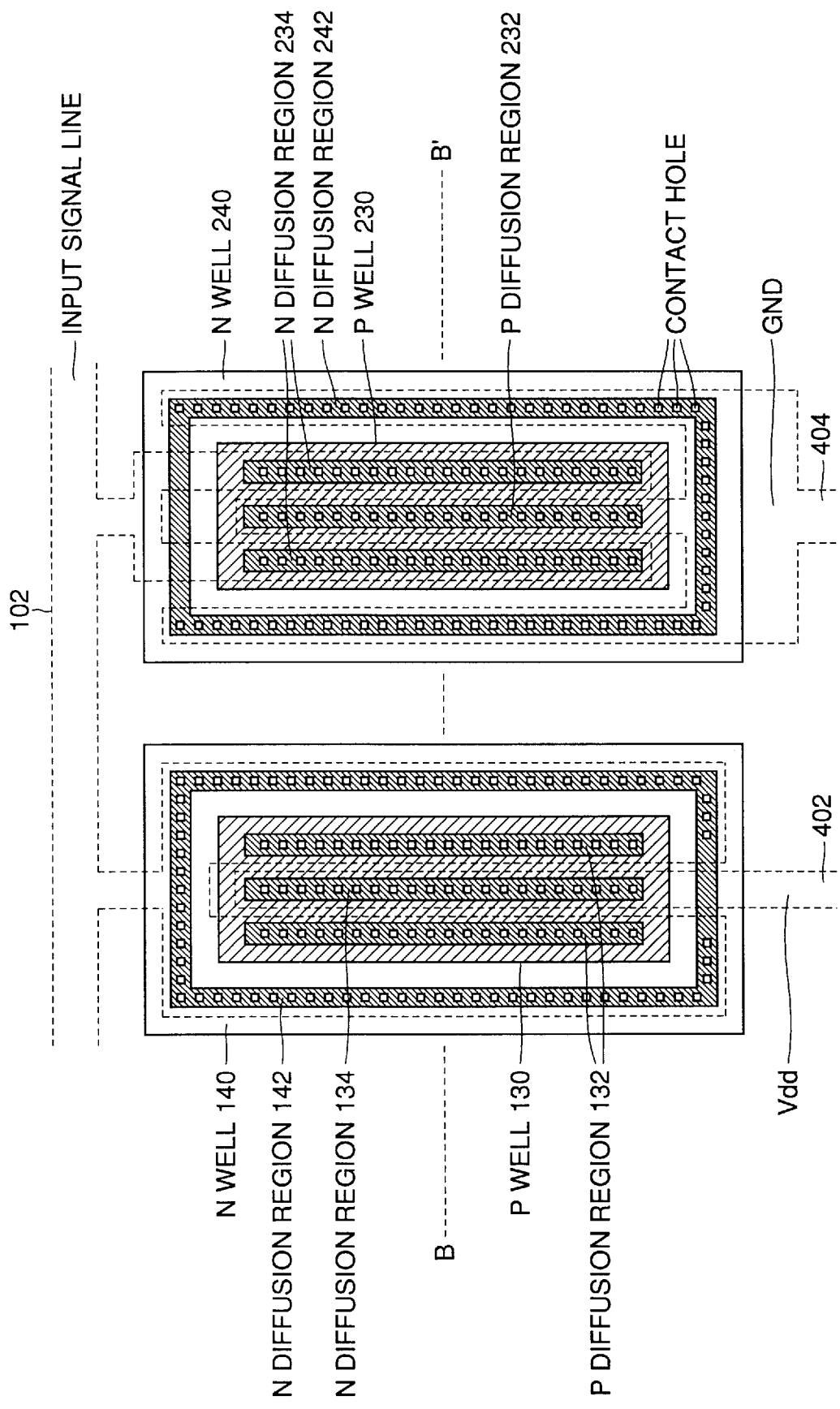
FIG. 7 is a plan view of a configuration of clamp circuit 300 shown in FIG. 6.

FIG. 7 shows one example of the plan pattern of the configuration of the clamp circuit shown in FIG. 6.

The B–B' cross section in FIG. 7 corresponds to the cross sectional structure of clamp circuit 300 shown in FIG. 6.

In FIG. 7, n well 140 is formed surrounding p well 130.

P well 130 is provided with to rectangular p diffusion regions 132 in the longitudinal direction.

N diffusion region 134 is also formed in p well 130 in the longitudinal direction such that n diffusion region 134 is interposed between the two p diffusion regions 132.

N well 140 is also provided with n diffusion region 142 which is formed to surround the p well.

N well 240 is also formed to surround p well 230.

Provided in p well region 230 in the longitudinal direction are two rectangular n diffusion regions 234.

P diffusion region 232 is provided in the longitudinal direction of p well 230 such that p diffusion region 232 is interposed between n diffusion regions 234.

Also provided in n well 240 is n diffusion region 242 which surrounds p well 230.

In the configuration shown in FIG. 7, n diffusion region 134 receives external power supply potential Vdd by means of a metal wiring 402.

Meanwhile, n well 240 receives ground potential GND from a metal wiring 404 via diffusion region 242.

P well 230 receives ground potential GND from metal wiring 404 via p diffusion region 232.

Furthermore input signal line 102 is connected to n well 140 via n diffusion region 142 and to p well 130 via p diffusion region 132.

Input signal line 102 is also connected to n diffusion region 234.

The configuration as above allows clamp circuit 300 with the cross sectional structure shown in FIG. 6.

First Variation of the Third Embodiment

Figure 8:
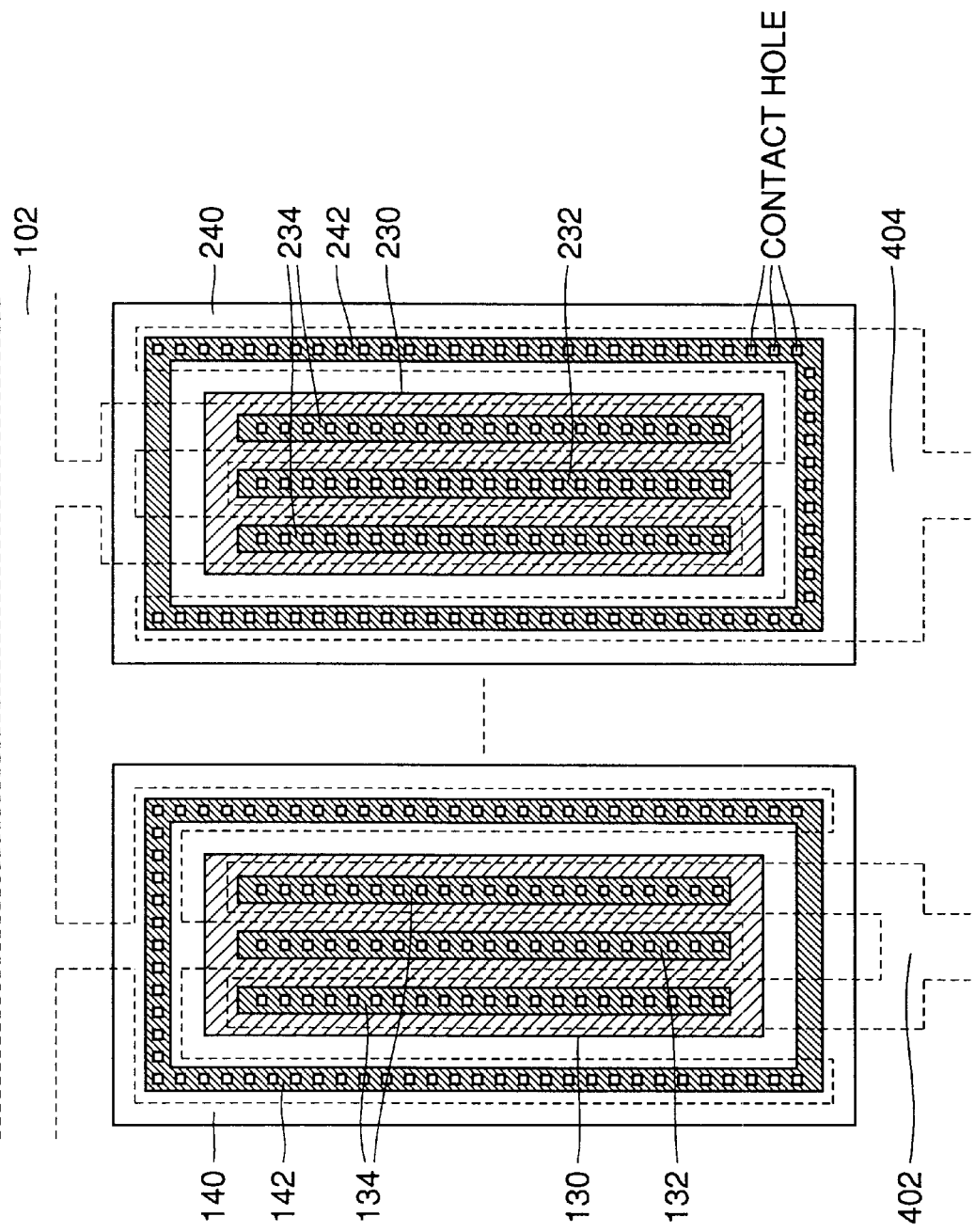
FIGS. 8, 9 and 10 show respective plan patterns of first, second and third variations of the third embodiment, respectively.

FIG. 8 shows another interconnection pattern which implements a configuration having a function similar to that of the clamp circuit shown in FIG. 6.

In FIG. 8, n well 140 surrounds p well 130.

Provided in p well 130 in the longitudinal direction are two rectangular n diffusion regions 134.

P diffusion region 132 is also formed in the longitudinal direction of p well 130 such that p diffusion region 132 is interposed between the two n diffusion regions 134.

Also provided in n well 140 is n diffusion region 142 which surrounds the p well.

Input signal line 102 is connected to n well 140 via n diffusion region 142 and to p well 130 via p diffusion region 132.

N diffusion region 134 receives power supply potential Vdd from metal wiring 402.

The configurations of the portions of p well 230 and n well 240 are similar to those shown in FIG. 7. Accordingly, the identical portions are designated by the identical reference characters and a description thereof will not be repeated.

The configuration as above allows a clamp circuit which has a function similar to that of clamp circuit 300 having the cross sectional structure shown in FIG. 6.

Second Variation of the Third Embodiment

Figure 9:
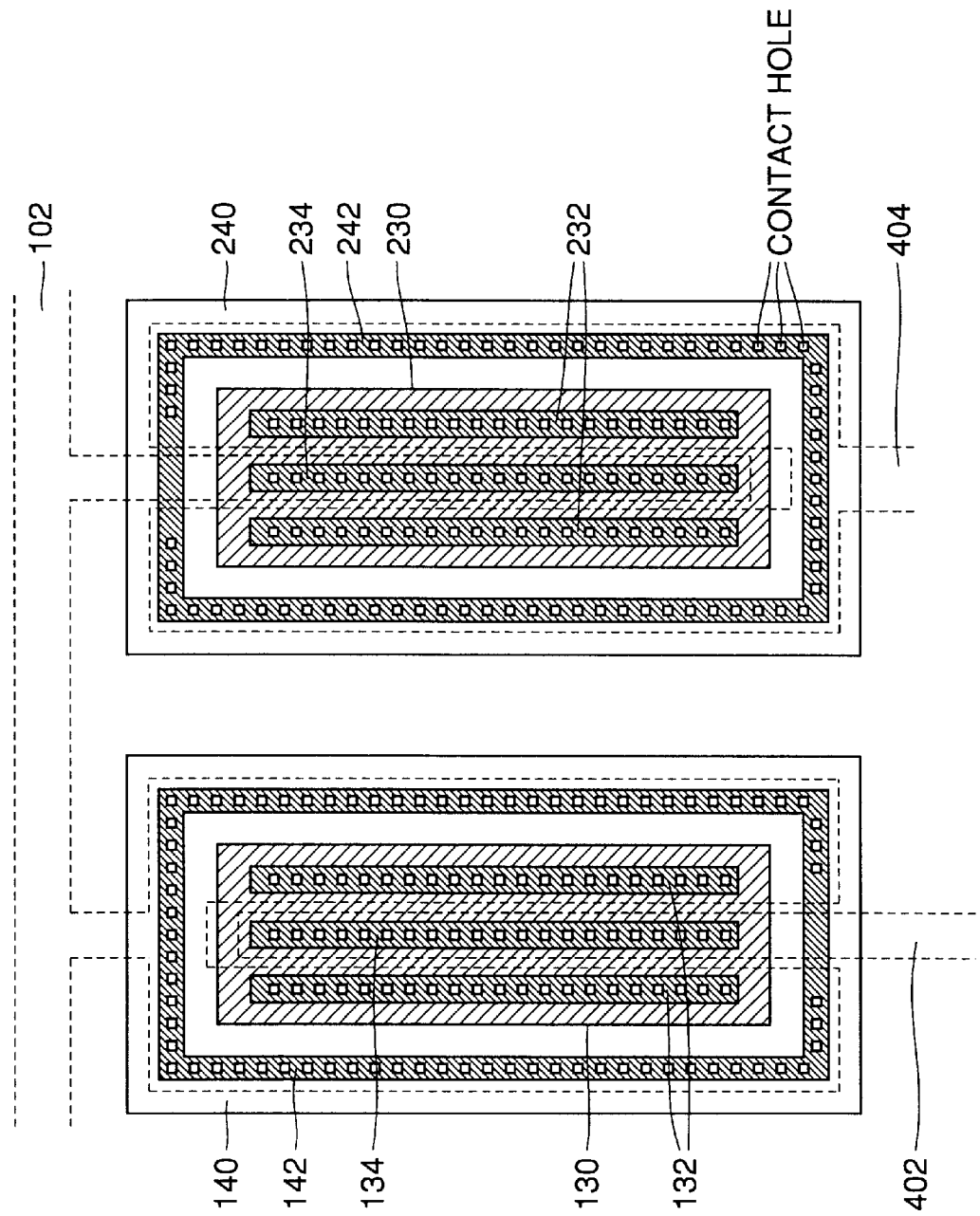

FIG. 9 is a plan view of another example of the plan pattern of a clamp circuit having a function similar to that of the clamp circuit shown in FIG. 6.

In FIG. 9 n well 240 surrounds p well 230.

Provided in p well 230 in the longitudinal direction are two rectangular p diffusion regions 232.

N diffusion region 234 is also formed in the longitudinal direction of p well 230 such that n diffusion region 234 is interposed between the two p diffusion regions 232.

Also provided n well 240 is n diffusion region 242 which surrounds p well 230.

N diffusion region 234 is connected to input signal line 102.

P well 230 and n well 240 receive ground potential GND from metal wiring 404 via p diffusion region 232 and n diffusion region 242 respectively.

The configurations of the portions of p well 230 and n well 140 are similar to those shown in FIG. 7. Accordingly the identical portions are designated by the identical reference characters and a description thereof will not be repeated.

The configuration as above allows a clamp circuit which has a function similar to that of clamp circuit 300 having the cross sectional structure shown in FIG. 6.

Third Variation of the Third Embodiment

Figure 10:
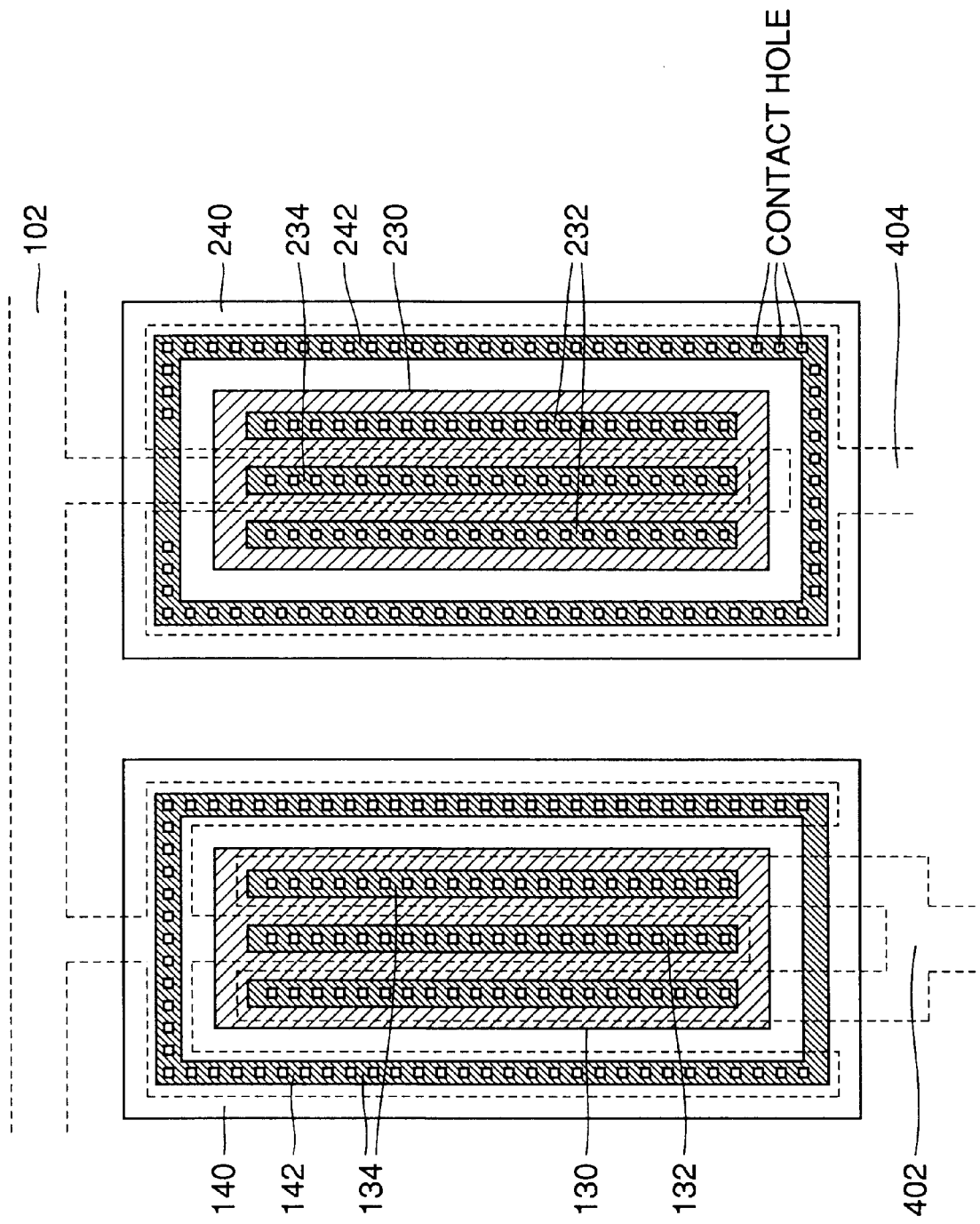

FIG. 10 is a plan view showing another example of the plan pattern of a clamp circuit having a function similar to that of clamp circuit 300 shown in FIG. 6.

In FIG. 10, n well 140 surrounds p well 130.

Provided in p well 130 in the longitudinal direction are two rectangular n diffusion regions 134.

P diffusion region 132 is also formed in the longitudinal direction of p well 130 such that p diffusion region 132 is interposed between the two n diffusion regions 134.

Also formed in n well 140 is n diffusion region 142 which surrounds the p well.

Input signal line 102 is connected to n well 140 via n diffusion region 142 and to p well 130 via p diffusion region 132.

N diffusion region 134 receives power supply potential Vdd from metal wiring 402.

The portions of p well 230 and n well 240 are similar in configuration to those shown in FIG. 9. Accordingly, the identical portions are designated by the identical reference characters and a description thereof will not be repeated.

The configuration as above allows a clamp circuit which has a function similar to that of clamp circuit 300 having the cross sectional structure shown in FIG. 6.

Figure 11:
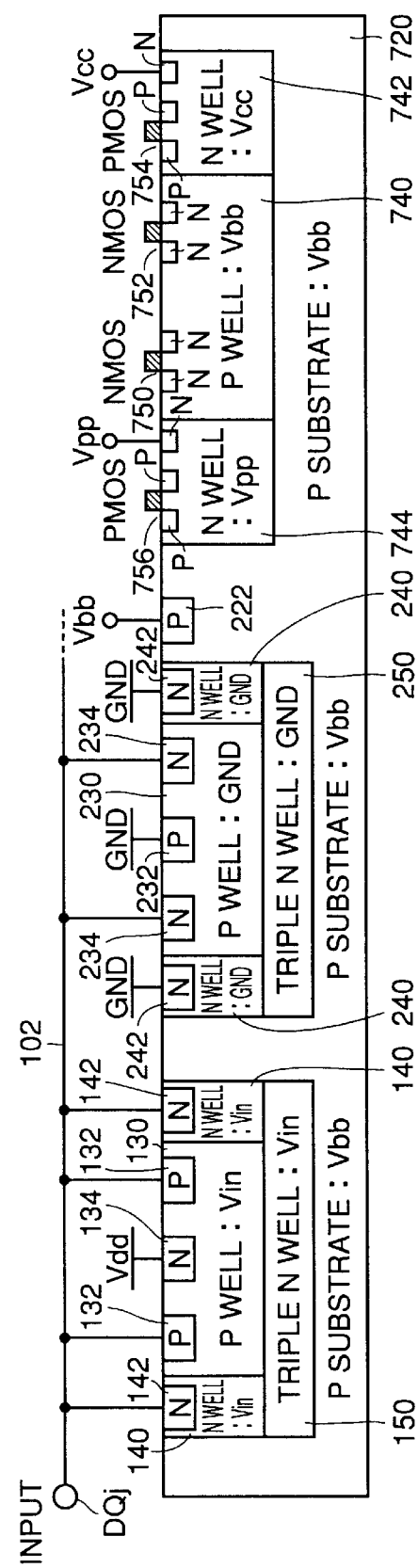
FIG. 11 shows a cross sectional configuration when the clamp circuit according to the third embodiment and a DRAM are formed on a same substrate.
Figure 12:
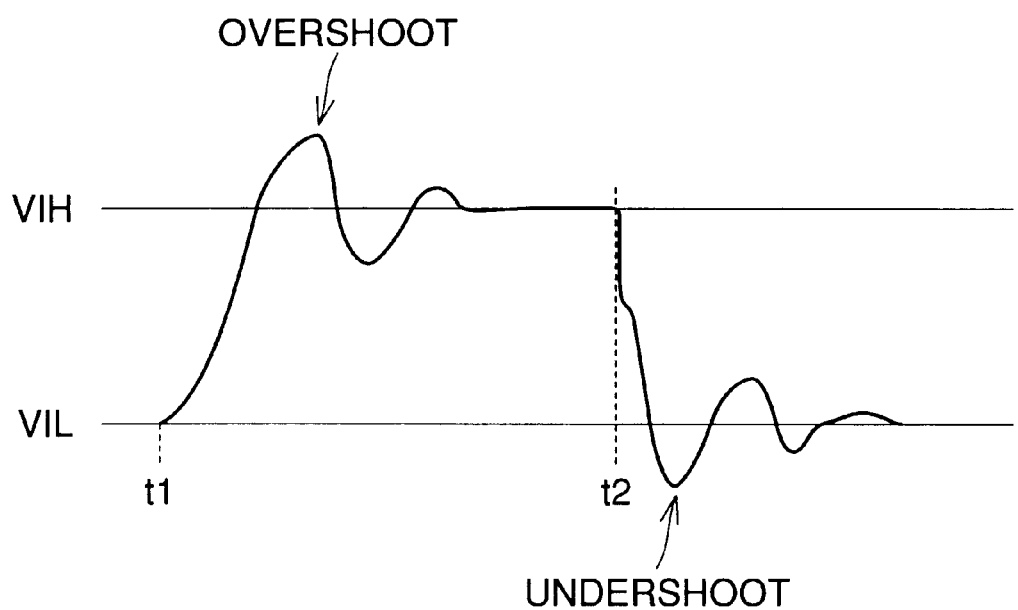
FIG. 12 is a timing chart representing how an input signal changes with time.
Figure 13:
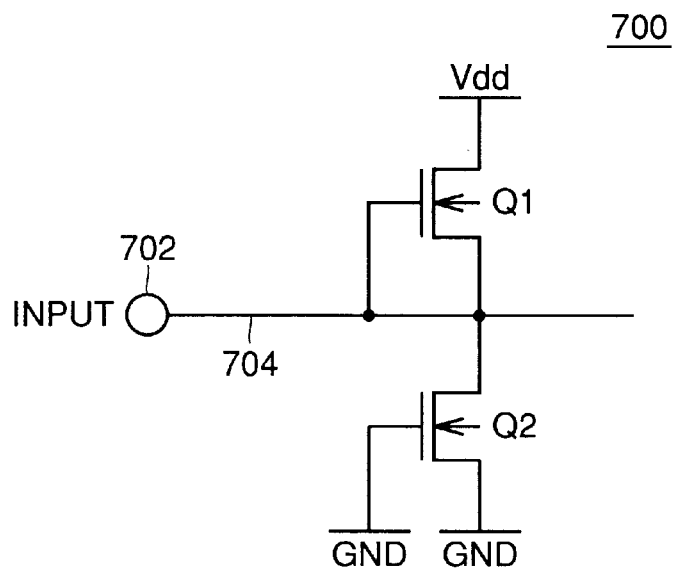
FIG. 13 is a circuit diagram of a configuration of a conventional clamp circuit 700.
Figure 14:
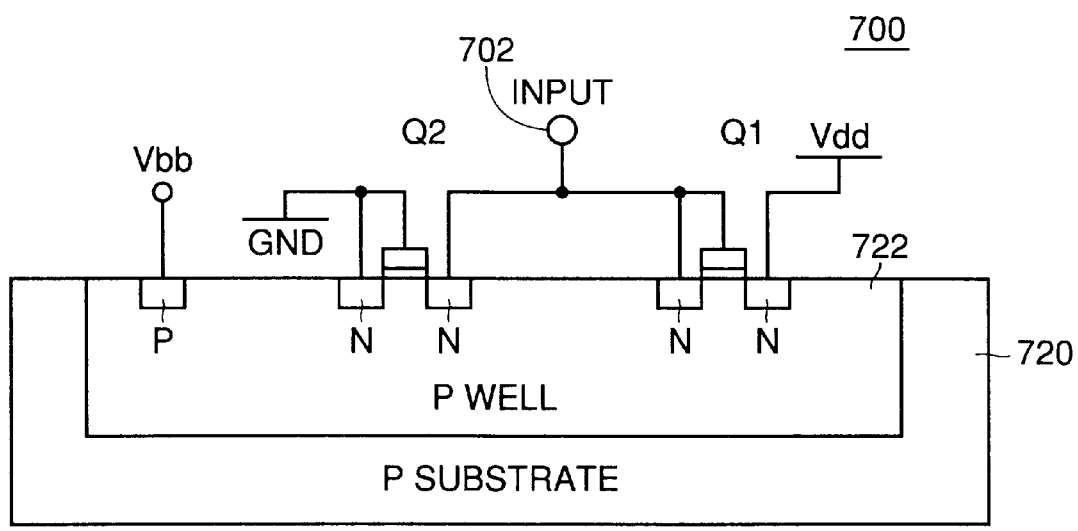
FIG. 14 is a cross section of the configuration of clamp circuit 700 shown in FIG. 13.
Figure 15:
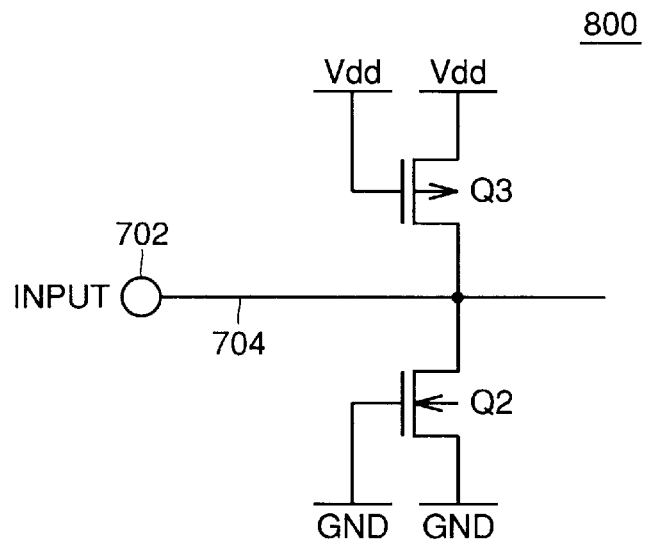
FIG. 15 is a circuit diagram showing a configuration of a conventional clamp circuit 800.
Figure 16:
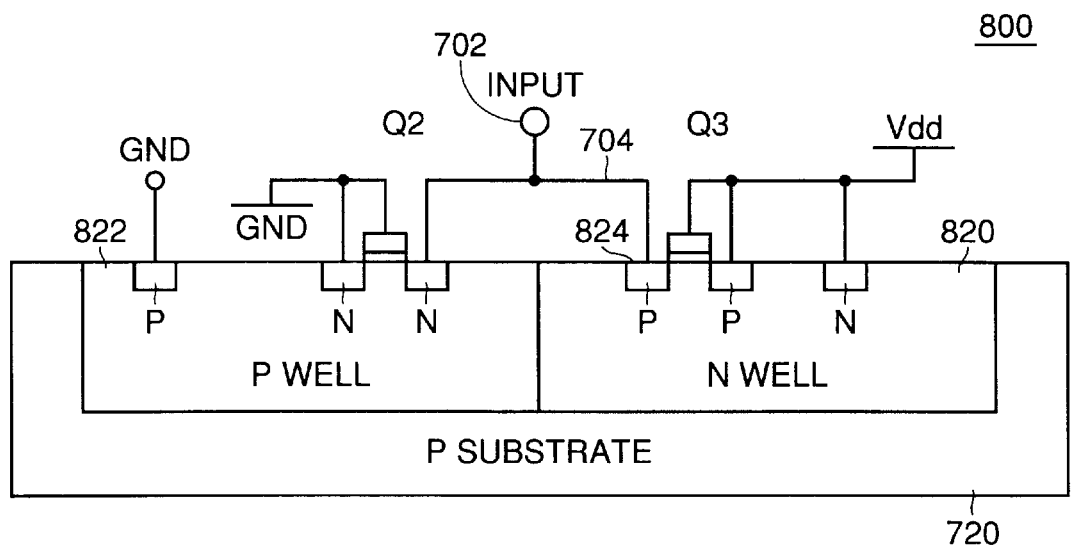
FIG. 16 is a cross section of the configuration of clamp circuit 800 shown in FIG. 15.
Figure 17:
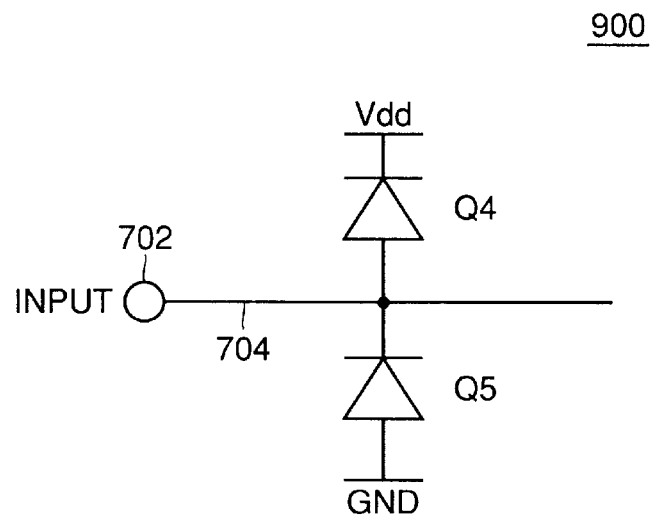
FIG. 17 is a circuit diagram showing a configuration of a conventional clamp circuit 900.
Figure 18:
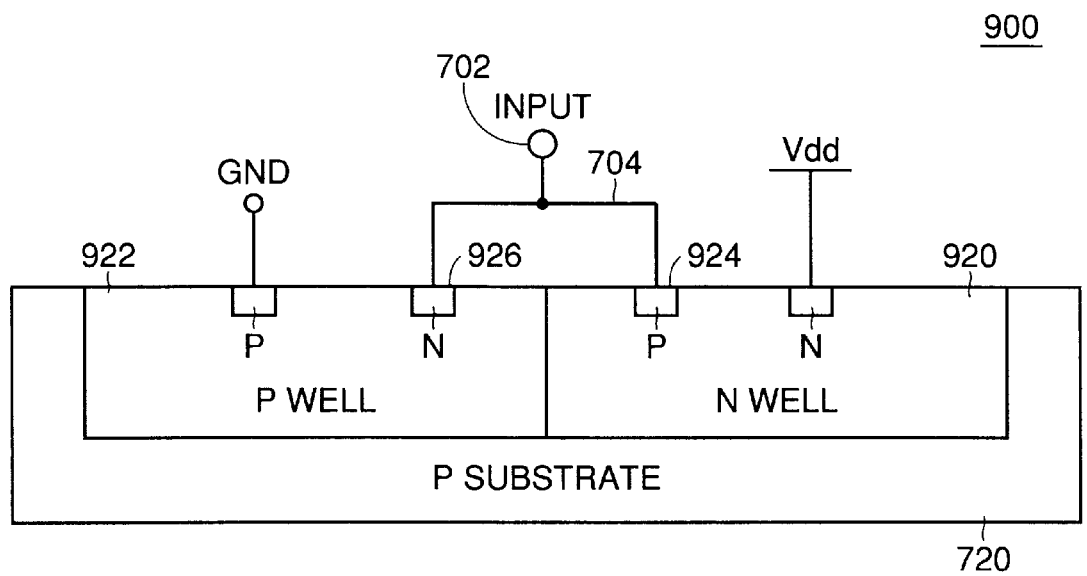
FIG. 18 is a cross section of the configuration of clamp circuit 900 shown in FIG. 17.

FIG. 11 is a cross section showing the FIG. 6 clamp circuit 300 formed together with the DRAM circuit shown in FIG. 9 on the same substrate.

The portions in FIG. 11 that are identical to the configurations of the DRAM of FIG. 19 and clamp circuit 300 of FIG. 6 are designated by the identical reference characters and a description thereof will not be repeated.

According to the configuration above, a clamp circuit which employs a pn junction and is capable of clamping both overshooting with respect to power supply potential and undershooting with respect to ground potential can be mounted on a substrate with a DRAM formed thereon.

This allows a clamp circuit which is highly resistant to input surge and the like and has significant clamping capability to be formed on the same substrate as a DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate of a first conductivity, comprising:
   an input pad receiving an external signal;
   a first power supply pad receiving a first power supply potential;
   a second power supply pad receiving a second power supply potential;
   a substrate potential generation means for receiving said first and second power supply potentials, generating a substrate potential and supplying said substrate potential to said semiconductor substrate;
   an input signal line transmitting a signal applied to said input pad;
   a first well region of a second conductivity, formed in a main surface of said semiconductor substrate and receiving a potential level of said input signal line;
   a second well region of said first conductivity, formed in said first well region such that said first well region surrounds said second well region except for said main surface and receiving a potential level of said input signal line; and
   a first impurity-doped region of said second conductivity formed in a main surface of said second well region and receiving said second power supply potential.

2. The semiconductor memory device according to claim 1, wherein:
   said first conductivity is p type;
   said second conductivity is n type;
   said second power supply potential is higher than said first power supply potential; and
   said substrate potential is a negative potential.

3. The semiconductor memory device according to claim 2, further comprising:
   down-converting means for receiving said first and second power supply potentials and generating an internal power supply potential having a value intermediate between said first and second power supply potentials; and
   an internal circuit responsive to a signal applied to said input signal line for holding written data, said internal circuit including
   a third well region of p-type formed in a main surface of said semiconductor substrate,
   a fourth well region of n type formed in a main surface of said semiconductor substrate adjacent to said third well region and receiving said internal power supply potential,
   a memory cell array formed in said third well region, said memory cell array having
      a plurality of word lines arranged in said memory cell array along a row direction,
      a plurality pairs of bit lines arranged in said memory cell array along a column direction,
      a plurality of memory cells each arranged at an intersection of said word line and said pair of bit lines and
      an n-channel sense amplifier responsive to data held in a selected memory cell in a read operation for amplifying a potential difference of a corresponding pair of bit lines, and
   a p-channel sense amplifier formed in said fourth well region, responsive to data held in a selected memory cell in a read operation for amplifying the potential difference of said corresponding pair of bit lines.

4. A semiconductor memory device formed on a semiconductor substrate of a first conductivity, comprising:
   an input pad receiving an external signal;
   a first power supply pad receiving a first power supply potential;
   a second power supply pad receiving a second power supply potential;
   substrate potential generating means for receiving said first and second power supply potentials generating a substrate potential and supplying said substrate potential to said semiconductor substrate;
   an input signal line transmitting a signal applied to said input pad;
   a first well region of a second conductivity, formed in a main surface of said semiconductor substrate and receiving a predetermined potential;
   a second well region of said first conductivity formed in said first well region such that said first well region surrounds said second well region except for said main surface and receiving said first power supply potential; and
   a second impurity-doped region of said second conductivity formed in a main surface of said second well region and receiving a potential level of said input signal line.

5. The semiconductor memory device according to claim 4, wherein:
   said first conductivity is p type;
   said second conductivity is n type;

said second power supply potential is higher than said first power supply potential; and said substrate potential is a negative potential.

6. The semiconductor memory device according to claim 5, wherein said predetermined potential is said first power supply potential.

7. The semiconductor memory device according to claim 5, wherein said predetermined potential is said second power supply potential.

8. The semiconductor memory device according to claim 5, further comprising:

down-converting means for receiving said first and second power supply potentials and generating an internal power supply potential having a value intermediate between said first and second power supply potentials; and an internal circuit responsive to a signal applied to said input signal line for holding written data, said internal circuit including a third well region of p type formed in a main surface of said semiconductor substrate, a fourth well region of n type, formed in a main surface of said semiconductor substrate adjacent to said third well region and receiving said internal power supply potential, a memory cell array formed in said third well region, said memory cell array having a plurality of word lines arranged in said memory cell array along a row direction, a plurality of pairs of bit lines arranged in said memory cell array along a column direction, a plurality of memory cells each arranged at an intersection of said word line and said pair of bit lines and an n-channel sense amplifier responsive to data held in a memory cell selected in a read operation for amplifying a potential difference of a corresponding pair of bit lines, and a p-channel sense amplifier formed in said fourth well region, responsive to data held in a memory cell selected in a read operation for amplifying the potential difference of said corresponding pair of bit lines.

* * * * *